United States Patent
Koura et al.

(10) Patent No.: US 7,205,667 B2
(45) Date of Patent: Apr. 17, 2007

(54) SEMICONDUCTOR DEVICE HAVING COPPER WIRING

(75) Inventors: Yumiko Koura, Kawasaki (JP); Hideki Kitada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/995,082

(22) Filed: Nov. 23, 2004

(65) Prior Publication Data
US 2006/0012046 A1 Jan. 19, 2006

(30) Foreign Application Priority Data
Jul. 14, 2004 (JP) .............................. 2004-207251

(51) Int. Cl.
*H01L 23/522* (2006.01)
(52) U.S. Cl. .................. 257/767; 257/762; 257/758; 257/E23.145; 257/E23.161
(58) Field of Classification Search ............... 257/758, 257/762, 767, E23.145, E23.161; 438/687, 438/658, 659
See application file for complete search history.

(56) References Cited

U.S. PATENT DOCUMENTS

| | | | | |
|---|---|---|---|---|
| 6,090,710 A * | 7/2000 | Andricacos et al. | ........ | 438/687 |
| 6,268,291 B1 * | 7/2001 | Andricacos et al. | ........ | 438/694 |
| 6,500,749 B1 * | 12/2002 | Liu et al. | .................... | 438/618 |
| 6,572,982 B1 * | 6/2003 | Uzoh et al. | .................. | 428/675 |
| 6,589,874 B2 * | 7/2003 | Andricacos et al. | ........ | 438/694 |
| 6,753,610 B1 * | 6/2004 | Fukiage | ..................... | 257/762 |
| 2003/0201536 A1 * | 10/2003 | Ueno | ......................... | 257/750 |
| 2004/0155349 A1 * | 8/2004 | Nakamura et al. | .......... | 257/758 |

FOREIGN PATENT DOCUMENTS

| | | |
|---|---|---|
| JP | 2000-173949 | 6/2000 |
| JP | 2004-039916 | 2/2004 |

OTHER PUBLICATIONS

Korean Office Action dated Jul. 6, 2006, issued in corresponding Koran Patent Application No. 10-2005-0051727.

* cited by examiner

*Primary Examiner*—Matthew C. Landau
(74) *Attorney, Agent, or Firm*—Westerman, Hattori, Daniels & Adrian, LLP.

(57) ABSTRACT

A first interlayer insulating film made of insulting material is formed over an underlying substrate. A via hole is formed through the first interlayer insulating film. A conductive plug made of copper or alloy mainly consisting of copper is filled in the via hole. A second interlayer insulating film made of insulating material is formed over the first interlayer insulating film. A wiring groove is formed in the second interlayer insulating film, passing over the conductive plug and exposing the upper surface of the conductive plug. A wiring made of copper or alloy mainly consisting of copper is filled in the wiring groove. The total atom concentration of carbon, oxygen, nitrogen, sulfur and chlorine in the conductive plug is lower than the total atom concentration of carbon, oxygen, nitrogen, sulfur and chlorine in the wiring.

7 Claims, 6 Drawing Sheets

SEMICONDUCTOR DEVICE HAVING COPPER WIRING

CROSS REFERENCE TO RELATED APPLICATION

This application is based on and claims priority of Japanese Patent Application No. 2004-207251 filed on Jul. 14, 2004, the entire contents of which are incorporated herein by reference.

BACKGROUND OF THE INVENTION

A) Field of the Invention

The present invention relates to a semiconductor device having copper wirings and conductive plugs and its manufacture method.

B) Description of the Related Art

As LSI wiring material, copper (Cu) is now used which has a lower electric resistance and a higher electromigration resistance than aluminum (Al) used conventionally. A damascene method has generally been used for forming a Cu wiring, by which a Cu layer is deposited on an interlayer insulating film and filled in a recess formed in the film, and thereafter an unnecessary Cu layer is removed by chemical mechanical polishing (CMP). A single damascene method executes separately the process of filling a Cu layer in a via hole and CMP and the process of filling a Cu layer in a wiring groove and CMP. A dual damascene method executes the process of filling a Cu layer in a via hole and a wiring groove at the same time.

Japanese Patent Laid-open Publication No. 2000-173949 discloses a method of forming a Cu wiring by the damascene method. With this method, when a Cu layer is filled in a via hole or a wiring groove by an electrolytic plating method, a current/voltage supply method is altered during plating. For example, a d.c. plating is performed first and at an intermediate time a constant current plating is performed. By altering the current/voltage supply method, generation of voids can be suppressed.

By using Cu instead of Al conventionally used, an electromigration resistance of a wiring can be improved. A conventional Cu wiring forming method is, however, unsatisfactory in that a sufficient stressmigration resistance cannot be obtained in some cases.

SUMMARY OF THE INVENTION

An object of this invention is to provide a semiconductor device having a sufficient electromigration resistance and a sufficient stressmigration resistance and its manufacture method.

According to one aspect of the present invention, there is provided a semiconductor device comprising: an underlying substrate; a first interlayer insulating film formed over the underlying substrate and made of insulating material; a via hole formed through the first interlayer insulating film; a conductive plug filled in the via hole and made of copper or alloy mainly consisting of copper; a second interlayer insulating film formed over the first interlayer insulating film and made of insulating material; a wiring groove formed in the second interlayer insulating film, passing over the conductive plug and exposing an upper surface of the conductive plug; and a wiring filled in the wiring groove and made of copper or alloy mainly consisting of copper, wherein a purity of copper in the conductive plug is different from a purity of copper in the wiring.

According to another aspect of the present invention, there is provided a semiconductor device comprising: an underlying substrate; a first interlayer insulating film formed over the underlying substrate and made of insulating material; a via hole formed through the first interlayer insulating film; a conductive plug filled in the via hole and made of copper or alloy mainly consisting of copper; a second interlayer insulating film formed over the first interlayer insulating film and made of insulating material; a wiring groove formed in the second interlayer insulating film, passing over the conductive plug and exposing an upper surface of the conductive plug; and a wiring filled in the wiring groove and made of copper or alloy mainly consisting of copper, wherein a total atom concentration of carbon, oxygen, nitrogen, sulfur and chlorine in the conductive plug is lower than a total atom concentration of carbon, oxygen, nitrogen, sulfur and chlorine in the wiring.

According to another aspect of the present invention, there is provided a semiconductor manufacture method comprising steps of: (a) forming a first interlayer insulating film made of insulating material over an underlying substrate; (b) forming a via hole through the first interlayer insulating film; (c) filling a conductive plug made of copper or alloy mainly consisting of copper in the via hole by a plating method; (d) forming a second interlayer insulating film made of insulating material over the first interlayer insulating film with the conductive plug being filled in; (e) forming a wiring groove in the second interlayer insulating film, the wiring groove exposing an upper surface of the conductive plug; and (e) filling a wiring made of copper or alloy mainly consisting of copper in the wiring groove by a plating method using plating solution different from plating solution to be used at the step (c).

By making a purity of copper in a conductive plug different from a purity of copper in a wiring, it is possible to obtain an electromigration resistance and a stressmigration resistance suitable for the conductive plug and wiring. By setting an impurity concentration of the conductive plug relatively low, the electromigration resistance can be enhanced. By setting an impurity concentration of the wiring relatively high, a sufficient stressmigration can be ensured.

DESCRIPTION OF THE PREFERRED EMBODIMENTS

Figure 1:
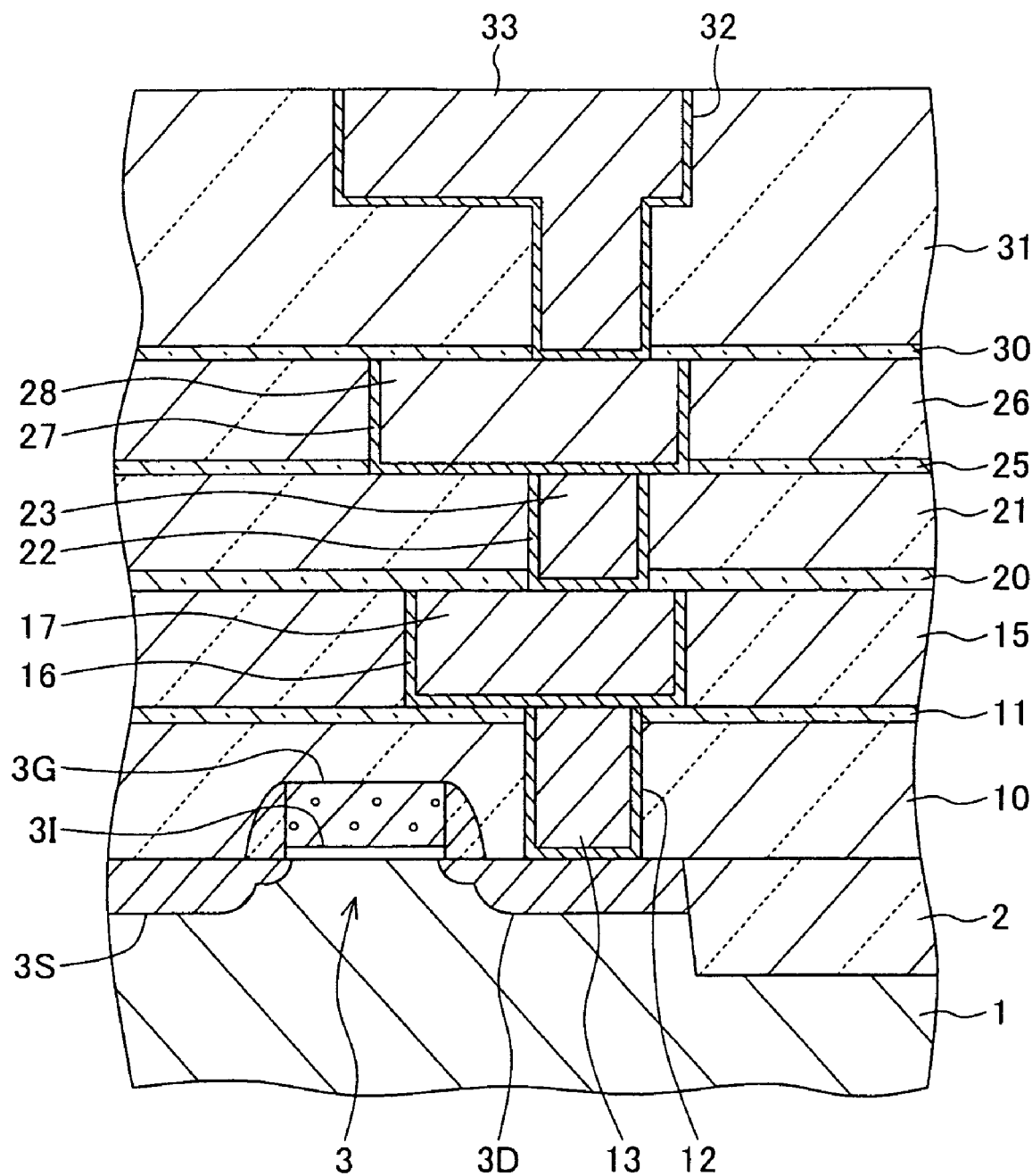
FIG. 1 is a cross sectional view of a semiconductor device according to an embodiment.

FIG. 1 is a cross sectional view of a semiconductor device according to the embodiment. In a surface layer of a semiconductor device 1 of silicon, an element isolation insulating film 2 of a shallow trench isolation (STI) structure is formed to define active regions. In an active region, a MOS transistor 3 is formed. The MOS transistor 3 is constituted of a source region 3S, a drain region 3D, a gate insulating film 3I and a gate electrode 3G.

An interlayer insulating film 10 of silicon oxide having a thickness of 300 nm and a protective film 11 of silicon carbide (SiC) having a thickness of 50 nm are formed on the semiconductor substrate 1, covering the MOS transistor 3. A via hole is formed through the protective film 11 and interlayer insulating film 10, exposing a partial surface of the drain region 3D on the bottom of the via hole. A conductive plug 13 of tungsten (W) is filled in the via hole. A barrier metal layer 12 of TiN having a thickness of 25 nm is disposed between the conductive plug 13 and the inner surface of the via hole.

An interlayer insulating film 15 of porous silica having a thickness of 150 nm is formed on the protective film 11. A wiring groove is formed through the interlayer insulating film 15, passing over the underlying conductive plug 13. In this wiring groove, a wiring 17 of copper is filled. A barrier metal layer 16 of tantalum (Ta) having a thickness of 15 nm is formed between the wiring 17 and the inner surface of the wiring trench.

A cap film 20 of SiC having a thickness of 80 nm and an interlayer insulating film 21 of porous silica having a thickness of 300 nm are formed on the interlayer insulating film 15. A via hole is formed through the two films 21 and 20, exposing a partial upper surface of the underlying wiring 17 on the bottom of the via hole. A diameter of the via hole is, for example, 130 nm. A conductive plug 23 of Cu is filled in the via hole. A barrier metal layer 22 of Ta having a thickness of 15 nm is disposed between the conductive plug 23 and the inner surface of the via hole. The cap film 20 prevents diffusion of Cu atoms in the underlying Cu wiring 17.

A cap film 25 of SiC having a thickness of 50 nm and an interlayer insulating film 26 of porous silica having a thickness of 150 nm are formed on the interlayer insulating film 21. A wiring groove is formed through the two films 26 and 25, passing over the underlying conductive plug 23. A width of the wiring groove is, for example, 130 nm. A wiring 28 of Cu is filled in this wiring groove. A barrier metal layer 27 of Ta having a thickness of 15 nm is disposed between the wiring 28 and the inner surface of the wiring groove. The barrier metal layer 27 is also disposed between the wiring 28 and conductive plug 23.

A cap film 30 of SiC having a thickness of 50 nm and an interlayer insulating film 31 of porous silica having a thickness of 550 nm are formed on the interlayer insulating film 26. A Cu wiring 33 is filled in the cap film 30 and interlayer insulating film 31 by a dual damascene method. A barrier metal layer 32 of Ta having a thickness of 15 nm is disposed between the Cu wiring 33 and the via hole and wiring groove.

Next, with reference to FIG. 1 and FIGS. 2A to 2F, description will be made on a semiconductor device manufacture method according to the embodiment.

The element isolation insulating film 2, MOS transistor 3, interlayer insulating film 10, protective film 11, barrier metal layer 12 and conductive plug 13 shown in FIG. 1 can be formed well-known photolithography, etching, chemical vapor deposition (CVD), chemical mechanical polishing (CMP) and the like.

On the protective film 11, the interlayer insulating film 15 of porous silica is formed. For example, the interlayer insulating film 15 can be formed by coating Nano Clustering Silica (NCS) which is low dielectric constant material available from Catalysts & Chemicals Ind. Co. Ltd. The wiring groove is formed through the interlayer insulating film 15. The upper surface of the underlying conductive plug 13 is therefore exposed on the bottom of the wiring groove.

A Ta film is formed by sputtering, the Ta film covering the inner surface of the wiring groove and the upper surface of the interlayer insulating film 15. A Cu seed layer is formed on the Ta film by sputtering. On the seed layer, Cu is deposited by electrolytic plating to fill Cu in the wiring groove. The Ta film and Cu film deposited at a level higher than the upper surface of the interlayer insulating film 15 are removed by CMP to thereby leave the barrier metal layer 16 and Cu wiring 17 in the wiring groove.

Figure 2A:
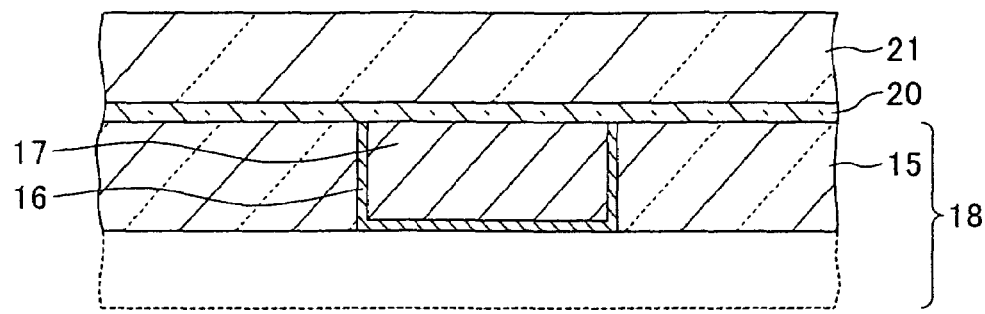
FIGS. 2A to 2F are cross sectional views of a semiconductor device during manufacture, illustrating a semiconductor device manufacture method according to an embodiment.

As shown in FIG. 2A, an underlying substrate 18 can be obtained which exposes the upper surface of the Cu wiring 17 on a partial surface of the substrate. On the underlying substrate 18, the cap film 20 of SiC is formed by CVD. On the cap film 20, the interlayer insulating film 21 of porous silica is formed. The interlayer insulating film 21 can be formed by the same method as that used for forming the lower level interlayer insulating film 15.

Figure 2B:
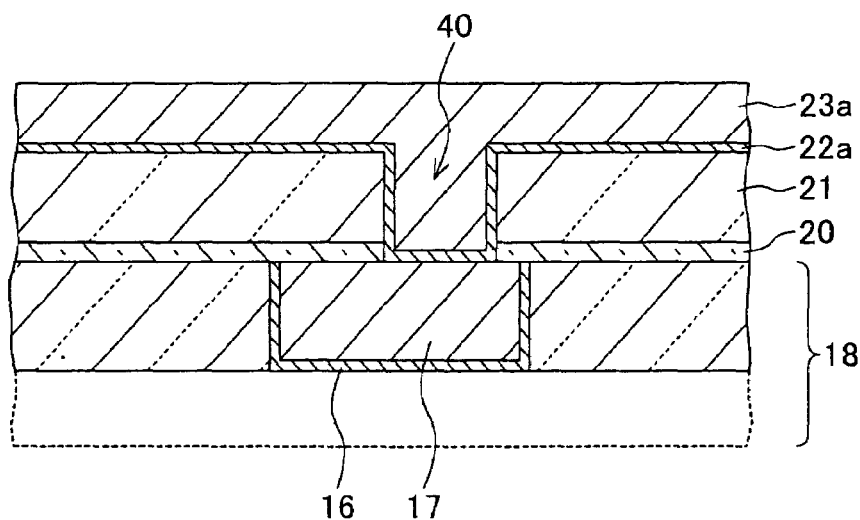

As shown in FIG. 2B, a via hole 40 is formed through the interlayer insulating film 21 and cap layer 20, exposing a partial surface of the underlying wiring 17. In etching the interlayer insulating film 21 of porous silica, dry etching is performed by using total F-series substitution fluorocarbon as etching gas. In etching the cap layer 20 of SiC, dry etching is performed by using H-containing fluorocarbon as etching gas.

A Ta film 22a is formed by sputtering, covering the inner surface of the via hole 40 and the upper surface of the interlayer insulating film 21. On the Ta film 22a, a Cu seed layer is formed by sputtering. On the Cu seed layer, Cu is deposited through electrolytic plating by using via hole filling solution to form a Cu film 23a. The Cu film 23a deposited has a thickness sufficient for completely filling the via hole 40 with the Cu film 23a. The Ta film 22a and Cu film 23a deposited at a level higher than the upper surface of the interlayer insulating film 21 are removed by CMP.

Figure 2C:
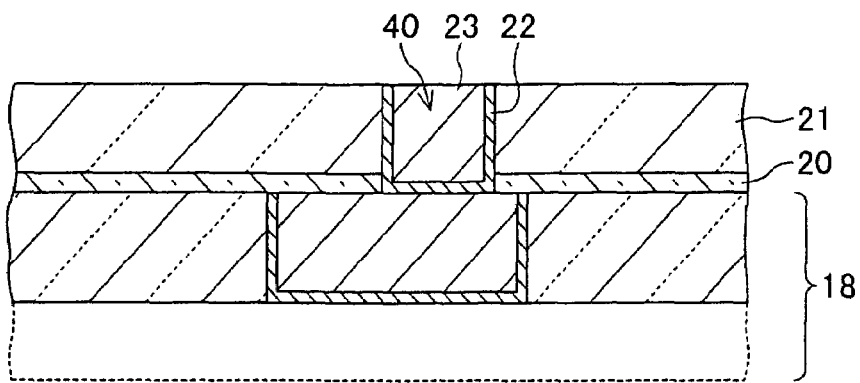

As shown in FIG. 2C, the barrier metal layer 22 of Ta and the Cu wiring 23 are therefore left in the via hole 40.

Figure 2D:
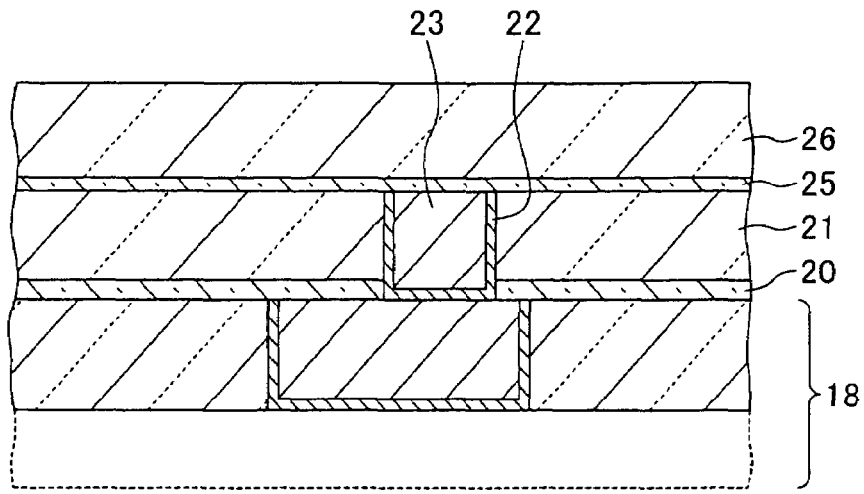

As shown in FIG. 2D, on the interlayer insulating film 21, the cap film 25 of SiC and the interlayer insulating film 26 of porous silica are formed by the same method as that used for forming the lower level cap film 20 and interlayer insulating film 21.

Figure 2E:
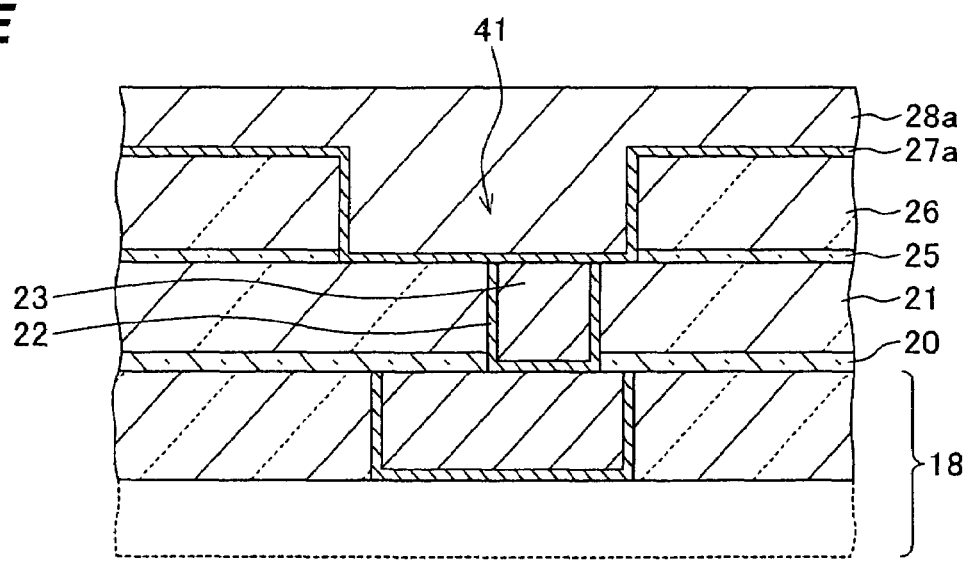

As shown in FIG. 2E, a wiring groove 41 is formed through the interlayer insulating film 26 and cap film 25, exposing the upper surface of the conductive plug 23 on the bottom of the wiring groove 41. A Ta film 27a is formed by sputtering, covering the inner surface of the wiring groove 41 and the upper surface of the interlayer insulating film 26. On the Ta film 27a, a Cu seed layer is formed by sputtering. On the seed layer, Cu is deposited through electrolytic plating by using wiring depositing solution to form a Cu film 28a. The Cu film 28a deposited has a thickness sufficient for completely filling the wiring groove 41 with the Cu film 28a. The Cu film 28a and Ta film 27a are subjected to CMP to expose the upper surface of the interlayer insulating film 26.

Figure 2F:
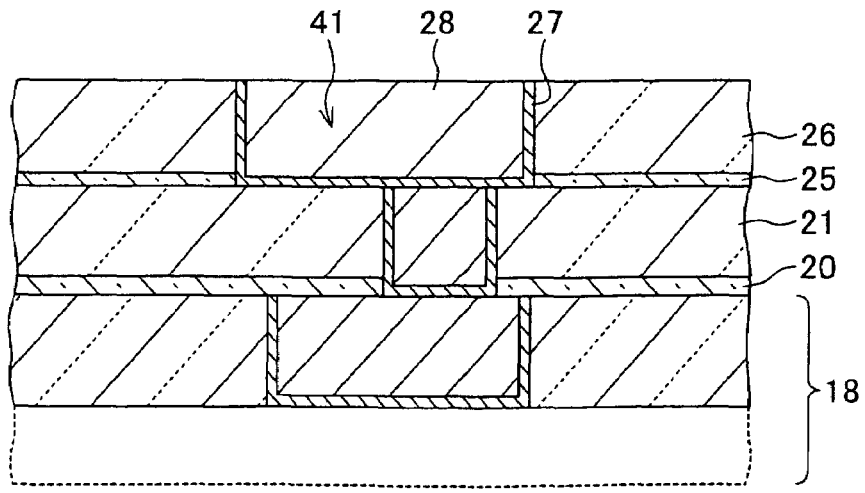

As shown in FIG. 2F, the barrier metal layer 27 of Ta and the Cu wiring 28 are therefore left in the wiring groove 41. A via layer including the interlayer insulating film 21 and conductive plug 23 and a wiring layer including the interlayer insulating film 26 and wiring 28 are formed by a single damascene method.

A wiring layer including the cap film 30, interlayer insulating film 31, barrier metal layer 32 and Cu wiring 33 shown in FIG. 1 is formed by a dual damascene method. Electrolytic plating solution for the Cu wiring 33 may be the via hole filling solution used for forming the lower level conductive plug 33 of the wiring depositing solution used for forming the lower level wiring 28.

The via hole filling solution used in this embodiment is manufactured by Rohm and Haas Company of USA and contains 5 to 10 ml/l of accelerator for increasing a film forming speed, 1 to 5 ml/l of suppressor for decreasing the film forming speed, and 1 to 3 ml/l of leveler for smoothing a film surface. The wiring depositing solution is manufactured by Enthone Inc. and contains 5 to 10 ml/l of accelerator, 1 to 5 ml/l of suppressor and 1 to 3 ml/l of leveler.

Figure 3A:
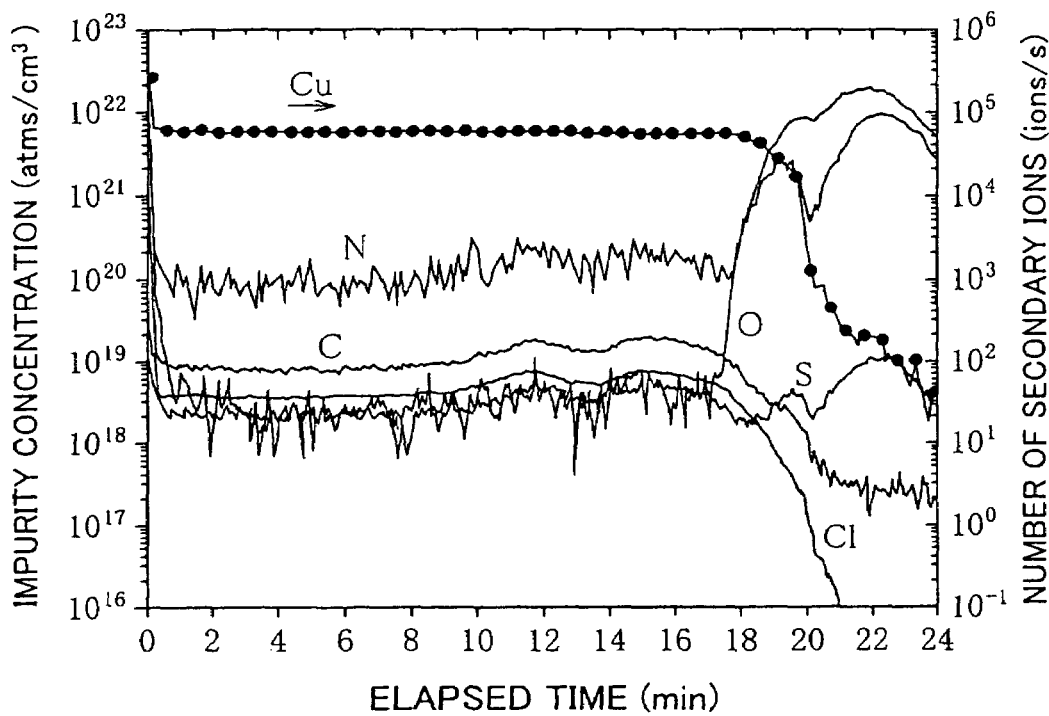
FIG. 3A is a graph showing SIMS analysis results of a Cu film formed by using solution for depositing a wiring.
Figure 3B:
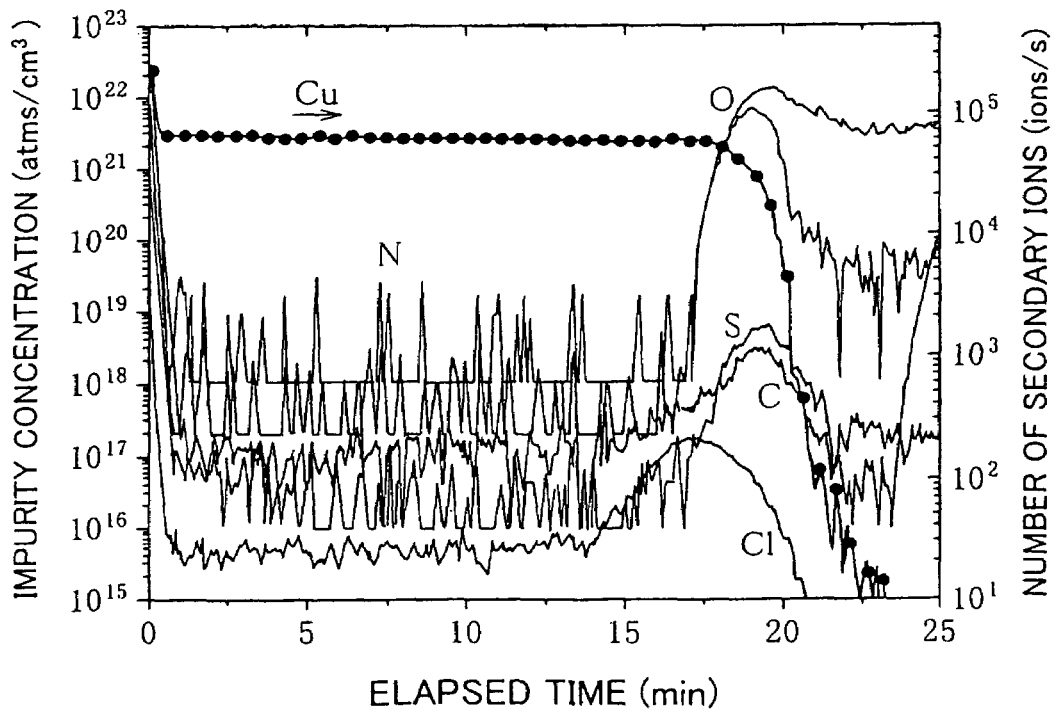
FIG. 3B is a graph showing SIMS analysis results of a Cu film formed by using solution for filling a via hole.

FIGS. 3A and 3B are graphs showing the measurement results, by secondary ion mass spectroscopy (SIMS), of impurity concentrations of a CU film formed by using via hole filling solution and a CU film formed by using wiring depositing solution, respectively. The abscissa represents a lapsed time from the analysis start in the unit of "minute" and the left ordinate represents an impurity concentration in the unit of "atoms/cm$^3$". The right ordinate represents the number of detected secondary ions in the unit of "ions/s". The abscissa corresponds to the position of the Cu film in the depth direction. Polygonal lines fixed with symbols Cu, N, C, O, S and Cl represent the impurity concentrations of copper, nitrogen, carbon, oxygen, sulfur and chlorine, respectively.

Figure 4:
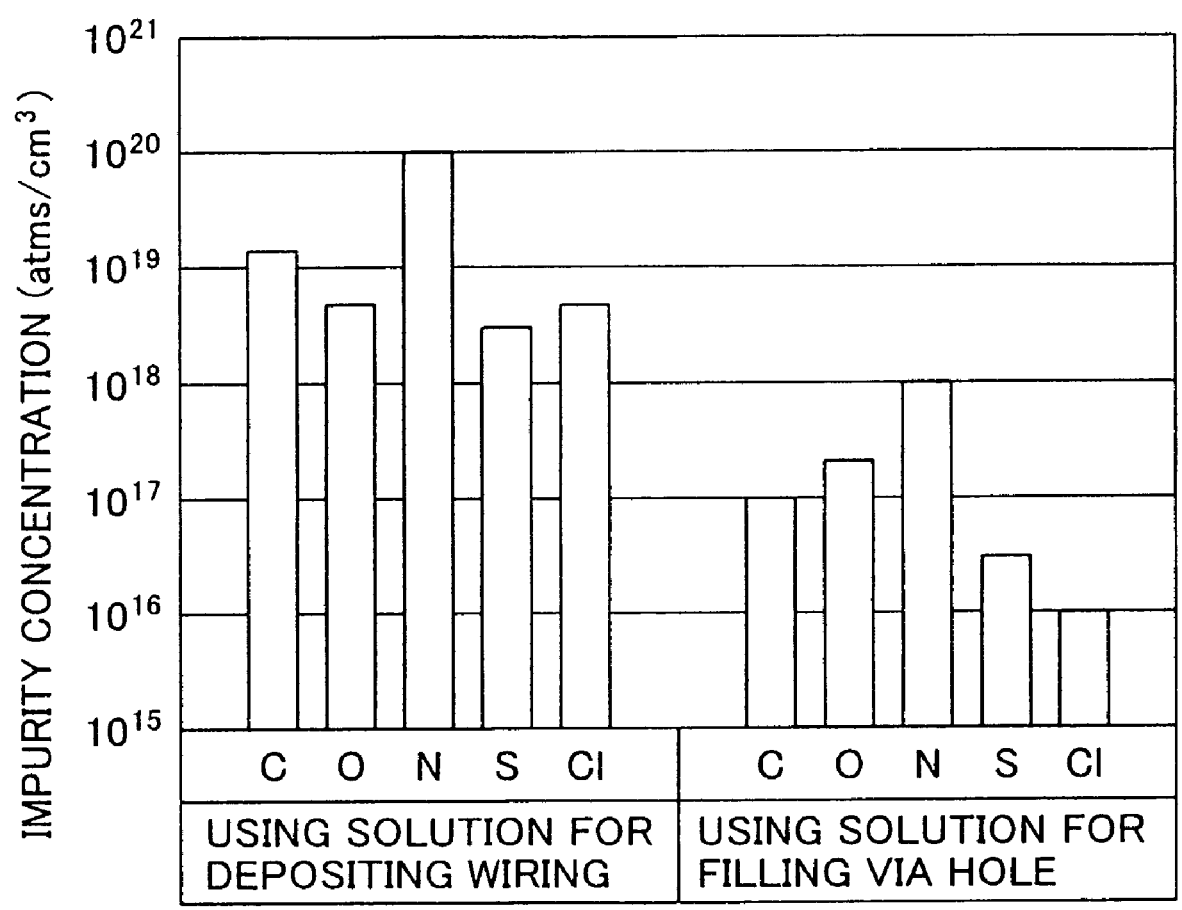
FIG. 4 is a graph showing impurity concentrations of a Cu film formed by using solutions for depositing a wiring and filling a via hole.

FIG. 4 shows the concentrations of impurity elements averaged relative to the depth direction of the Cu film. Five left bar graphs represent the impurity concentrations of the Cu film formed by using the wiring depositing solution, and five right bar graphs represent the impurity concentrations of the Cu film formed by using the via hole filling solution. It can be seen that the impurity concentrations of the Cu film formed by using the wiring depositing solution are higher than the impurity concentrations of the Cu film formed by using the via hole filling solution. In other words, the purity of Cu of the Cu film formed by using the wiring depositing solution is lower than the purity of Cu of the Cu film formed by using the via hole filling solution. The total impurity concentration of carbon, oxygen, nitrogen, sulfur and chlorine of the Cu film formed by using the wiring depositing solution is about $1 \times 10^{20}$ atoms/cm$^3$, whereas the total impurity concentration of the Cu film formed by using the via hole filling solution is about $1 \times 10^{18}$ atoms/cm$^3$. There is a difference between the impurity concentrations by about two digits. This can be considered that the total impurity atom concentration in the via hole filling solution is lower than the total impurity atom concentration of the wiring depositing solution.

Figure 5:
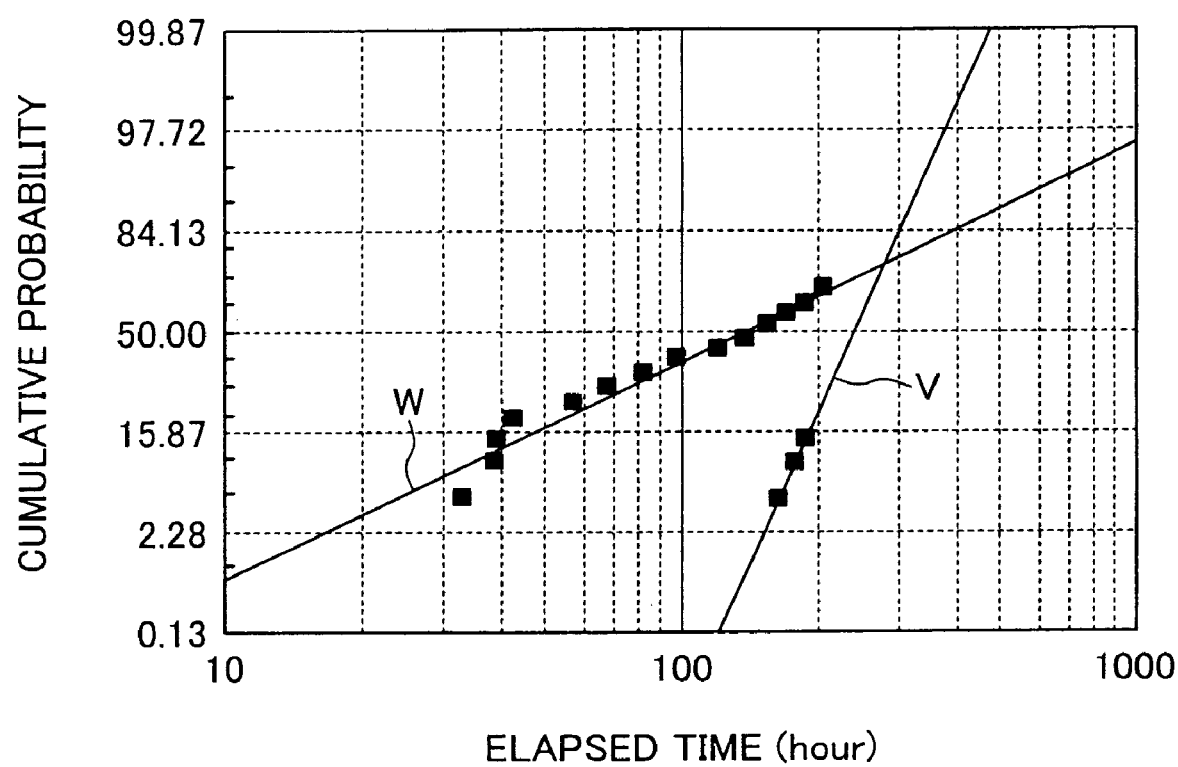
FIG. 5 is a graph showing the reliability evaluation results of current paths of evaluation samples.

FIG. 5 shows the results of reliability evaluation tests of evaluation samples each having a plurality of conductive plugs and wirings connected in series. The abscissa represents an elapsed time in the unit of "hour" from when a predetermined current is flowed through each evaluation sample, and the ordinate represents a cumulative probability of failure occurrence. Two groups of samples were prepared: a group W of evaluation samples whose conductive plugs and wires were formed by using the wiring depositing solution, and a group V of evaluation samples whose conductive plugs were formed by the via hole filling solution and whose wirings were formed by using the wiring depositing solution. Namely, the impurity concentration of the conductive plug of the group V sample is lower than that of the wiring. Twenty samples were evaluated for each of the groups W and V. In FIG. 5, straight lines W and V indicate the measurement results of the evaluation samples of the groups W and V, respectively.

After power feeding of 300 hours, conduction defects occurred in fourteen samples of the group W, and in three samples of the group V. These conduction defects result from electromigration. The maximum allowable current density of samples of the group W was about $1.6 \times 10^5$ A/cm$^2$ and that of samples of the group V was about $1.5 \times 10^5$ A/cm$^2$.

As seen from the evaluation results, the electromigration resistance and maximum allowable current density can be improved by setting the impurity concentration of Cu of the conductive plug lower than the impurity concentration of Cu of the wiring. Improvement on the electromigration resistance may be ascribed to that voids are hard to be formed in the conductive plug because the impurity concentration of the conductive plug is set lower.

It can be considered that even if Cu of the wiring is set to have a high purity similar to the conductive plug, the electromigration resistance of the same degree as that of the group V can be obtained. However, it has been found that if the wiring is made highly pure, the stressmigration resistance of the wiring is degraded. This may be ascribed to that voids in the wring are likely to be diffused after being subjected to a heat history, because of a high purity.

In the embodiment described above, the impurity concentration of C of the conductive plug is set relatively low, whereas the impurity concentration of C of the wiring is set relatively high. Since the volume of the conductive plug is smaller than that of the wiring, the conductive plug is less influenced by degradation of the stressmigration resistance. Therefore, as shown in FIG. 5, a sufficient stressmigration is ensured while the high electromigration resistance is retained.

In order to present the sufficient effects of lowering the impurity concentration of the conductive plug, it is preferable that the total atom concentration of carbon, oxygen, nitrogen, sulfur and chlorine of the conductive plug is set to equal to or lower than one tenth of the total atom concentration of the wiring. It is also preferable that the total atom concentration of the conductive plug is set lower than $1 \times 10^{19}$ cm$^{-3}$ and the total atom concentration of the wiring is set higher than $1 \times 10^{19}$ cm$^{-3}$.

In the above-described embodiment, the wiring 33 may be formed by using either the via hole filling solution or the wiring depositing solution. Since the higher level wiring has a large size than that of a lower level wiring, the upper level wiring is intrinsically dispensed with the problem associated with electromigration and stressmigration.

In the above-described embodiment, although the wiring and conductive plug are made of Cu, similar advantages are expected even if they are made of alloy mainly consisting of Cu.

In the above-embodiment, the impurity atom concentration of the electrolytic plating solution for forming the conductive plug is set lower than that of the electrolytic plating solution for forming the wiring, to set the impurity concentration of the conductive plug lower than that of the wiring. In addition, it is expected that the impurity concentration of plated copper can be adjusted by changing the electrolytic plating current by using the same electrolytic plating solution.

The present invention has been described in connection with the preferred embodiments. The invention is not limited only to the above embodiments. It will be apparent to those skilled in the art that other various modifications, improvements, combinations, and the like can be made.

We claim:

1. A semiconductor device comprising:

an underlying substrate;

a first interlayer insulating film formed over the underlying substrate and made of insulating material;

a via hole formed through the first interlayer insulating film;

a conductive plug filled in the via hole and made of copper or an alloy containing mainly copper;

a second interlayer insulating film formed over the first interlayer insulating film and made of insulating material;

a wiring groove formed in the second interlayer insulating film, passing over the conductive plug and exposing an upper surface of the conductive plug; and a wiring filled in the wiring groove and made of copper or an alloy containing mainly copper;

wherein said conductive plug and said wiring made of said copper or said alloy containing mainly copper contain carbon, oxygen, nitrogen, sulphur and chlorine;

wherein a total atom concentration of carbon, oxygen, nitrogen, sulfur and chlorine in the conductive plug is lower than a total atom concentration of carbon, oxygen, nitrogen, sulfur and chlorine in the wiring.

2. The semiconductor device according to claim 1, wherein a barrier metal layer for preventing copper diffusion is disposed between an inner surface of the wiring groove and the wiring, and the barrier metal layer is also disposed between the wiring and the conductive plug.

3. The semiconductor device according to claim 1, wherein the total atom concentration of carbon, oxygen, nitrogen, sulfur and chlorine in the conductive plug is equal to or lower than one tenth of the total atom concentration of carbon, oxygen, nitrogen, sulfur and chlorine in the wiring.

4. The semiconductor device according to claim 2, wherein the total atom concentration of carbon, oxygen, nitrogen, sulfur and chlorine in the conductive plug is equal to or lower than one tenth of the total atom concentration of carbon, oxygen, nitrogen, sulfur and chlorine in the wiring.

5. The semiconductor device according to claim 1, wherein the total atom concentration of the conductive plug is lower than $1\times10^{19}$ cm$^{-3}$ and the total atom concentration of the wiring is higher than $1\times10^{19}$ cm$^{-3}$.

6. The semiconductor device according to claim 2, wherein the total atom concentration of the conductive plug is lower than $1\times10^{19}$ cm$^{-3}$ and the total atom concentration of the wiring is higher than $1\times10^{19}$ cm$^{-3}$.

7. The semiconductor device according to claim 3, wherein the total atom concentration of the conductive plug is lower than $1\times10^{19}$ cm$^{-3}$ and the total atom concentration of the wiring is higher than $1\times10^{19}$ cm$^{-3}$.

* * * * *